(12) United States Patent
Kim et al.

(10) Patent No.: US 11,269,423 B2
(45) Date of Patent: Mar. 8, 2022

(54) SIGNAL INPUT DEVICE AND PORTABLE TERMINAL INCLUDING SAME

(71) Applicant: ITVERS CO., LTD., Seongnam-si (KR)

(72) Inventors: Youn Soo Kim, Seoul (KR); Ki Tae Kim, Seongnam-Si (KR)

(73) Assignee: ITVERS CO., LTD.

( * ) Notice: Subject to any disclaimer, the term of this patent is extended or adjusted under 35 U.S.C. 154(b) by 0 days.

(21) Appl. No.: 17/048,575

(22) PCT Filed: Apr. 16, 2019

(86) PCT No.: PCT/KR2019/004581
§ 371 (c)(1),
(2) Date: Oct. 16, 2020

(87) PCT Pub. No.: WO2019/203538
PCT Pub. Date: Oct. 24, 2019

(65) Prior Publication Data
US 2021/0165499 A1     Jun. 3, 2021

(30) Foreign Application Priority Data

Apr. 17, 2018    (KR) .......................... 10-2018-0044370

(51) Int. Cl.
*G06F 3/02*      (2006.01)
*G06F 3/033*     (2013.01)
(Continued)

(52) U.S. Cl.
CPC ............ *G06F 3/0202* (2013.01); *G06F 3/033* (2013.01); *H01H 25/04* (2013.01); *H04M 1/23* (2013.01)

(58) Field of Classification Search
CPC ...... G06F 3/0202; G06F 3/033; G06F 3/0338; H01H 25/04; H01H 2207/002;
(Continued)

(56) References Cited

U.S. PATENT DOCUMENTS

2007/0200735 A1*   8/2007   Stilley .................. G06F 1/1626
                                                           341/22
2009/0251340 A1*   10/2009   Arihara ................. H03K 17/97
                                                           341/35
(Continued)

FOREIGN PATENT DOCUMENTS

JP          2009251182 A     10/2009
KR        20140026014 A      3/2014
(Continued)

*Primary Examiner* — Amit Chatly
(74) *Attorney, Agent, or Firm* — Renaissance IP Law Group LLP (57) ABSTRACT

The signal input device according to an embodiment of the present inventive concept may have effects in that the number of buttons included in the signal input device can be reduced because different types of input signals can be generated depending on a direction of a laterally pushed manipulation force, and a configuration can be simplified, a production cost can be significantly reduced and two or more input signals can be simultaneously generated because a laterally pushed manipulation force can be detected although a separate pressure sensor is not provided.

14 Claims, 5 Drawing Sheets

(51) Int. Cl.
*H01H 25/04* (2006.01)
*H04M 1/23* (2006.01)

(58) Field of Classification Search
CPC .......... H01H 2025/004; H01H 25/065; H01H 25/002; H04M 1/23; H04M 1/236; H03K 17/96

See application file for complete search history.

(56) References Cited

U.S. PATENT DOCUMENTS

| | | | | |
|---|---|---|---|---|
| 2011/0120849 A1* | 5/2011 | Morimoto | ............ | G06F 3/0362 |
| | | | | 200/5 A |
| 2011/0157102 A1* | 6/2011 | Ando | ................... | H01H 25/041 |
| | | | | 345/184 |
| 2012/0072150 A1* | 3/2012 | Furukawa | ................ | G01B 7/00 |
| | | | | 702/65 |
| 2012/0215475 A1* | 8/2012 | Rutledge | ................ | G05G 9/047 |
| | | | | 702/94 |
| 2012/0256821 A1* | 10/2012 | Olsson | ................. | G06F 3/0338 |
| | | | | 345/156 |
| 2017/0336876 A1* | 11/2017 | Kim | ..................... | H01H 25/041 |
| 2018/0011509 A1* | 1/2018 | Maier | ...................... | G05G 5/05 |

FOREIGN PATENT DOCUMENTS

| | | |
|---|---|---|
| KR | 20160011516 A | 2/2016 |
| KR | 20160051260 A | 5/2016 |
| KR | 101637985 B1 | 7/2016 |
| KR | 20170058742 A | 5/2017 |

* cited by examiner

SIGNAL INPUT DEVICE AND PORTABLE TERMINAL INCLUDING SAME

TECHNICAL FIELD

The present disclosure relates to a signal input device configured to generate an input signal when a button is laterally pushed and a mobile terminal including the same and, more particularly, to a signal input device configured to generate different types of input signals in the direction in which a button is pushed even without a separate pressurization sensor, and a mobile terminal including the same.

BACKGROUND ART

Recently, in the case of a mobile terminal having a display capable of a touch input at the front thereof, such as a smartphone or a tablet PC, there is a tendency that total size is maintained without any change and only the size of the display is increased.

Accordingly, physical buttons, such as a home button and a back button disposed on the front part of the mobile terminal, are replaced with touch type buttons using a display.

Recently, development for positioning an input unit at the back of a mobile terminal for user convenience is performed, but there is a problem in that various signals cannot be input through the input unit positioned at the back because only a fingerprint recognition unit or a push button is applied as the input unit at the back.

Technical Problem

A signal input device and a mobile terminal including the same according to an embodiment of the present inventive concept have an object of solving the following objects in order to solve the above problems.

An object of the present inventive concept is to provide a push type signal input device configured to generate an input signal when a laterally pushed manipulation force is applied, generate different types of input signals depending on a direction of a manipulation force, and detect a laterally pushed manipulation force although a separate pressure sensor is not provided, and a mobile terminal including the same.

Objects of the present inventive concept are not limited to the aforementioned object, and other objects not described above may be evidently understood by those skilled in the art from the following description.

Technical Solution

A signal input device according to an embodiment of the present inventive concept includes a first housing including a bottom surface and a first barrier rib upward formed from the bottom surface, wherein the bottom surface is divided into an inside bottom surface and outside bottom surface of the first barrier rib, a plurality of first contact points is formed on the inside bottom surface, and second contact points corresponding to the first contact points are formed on the outer circumferential surface of the first barrier rib; a flexible printed circuit board assembly seated on the inside bottom surface and formed to have a bottom surface on one side electrically coupled to the first contact points; a push button including a first upper part and a second barrier rib downward extended from the outer end of the first upper part, wherein a bottom of the second barrier rib is seated and positioned on the outside bottom surface in a way to horizontally move; and a conductive member positioned between an outer circumferential surface of the first barrier rib and an inner circumferential surface of the second barrier rib, wherein a fine pattern for forming the first contact points, the second contact points, and connection lines between the first contact points and the second contact points is formed on the first housing by laser processing, and the fine pattern is filled with an electrical conductive material.

The signal input device further includes a second housing including a second upper part and a third barrier rib downward extended from the outer end of the second upper part. It is preferred that a first open part opened so that the first upper part is exposed is formed in the second upper part, and a bottom of the third barrier rib is coupled to the outer circumferential surface of the bottom surface of the first housing.

It is preferred that the signal input device further includes an elastic member positioned between an outer circumferential surface of the second barrier rib and an inner circumferential surface of the third barrier rib.

It is preferred that at least one first protruded part is formed in the outer circumferential surface of the bottom surface, at least one first groove part is formed at a bottom of the third barrier rib, and the first protruded part is inserted into the first groove part to couple the first housing and the second housing.

It is preferred that at least one second groove part is formed on the outer circumferential surface of the bottom surface, at least one second protruded part is formed at the bottom of the third barrier rib, and the second protruded part is inserted into the second groove part to couple the first housing and the second housing.

It is preferred that the flexible printed circuit board assembly includes a flexible printed circuit board has third contact points, corresponding to the first contact points, formed at the bottom surface on the one side and has a connection part, coupled to an external device, formed on the other side thereof; and an ACF film attached to the bottom surface of the flexible printed circuit board on the one side and electrically coupling the first contact points and the third contact points by downward pressurization.

It is preferred that the flexible printed circuit board assembly further includes a switch member positioned at the top surface of the flexible printed circuit board on the one side thereof and generating an electrical signal by downward pressurization.

It is preferred that the signal input device further includes a push button externally exposed to allow a user to downward pressurize the switch member.

It is preferred that the push button includes a push part coupled to a first upper part of the push button; and a column part positioned to penetrate a second open part formed in the first upper part, having one side coupled to the push part, and having the other side for delivering downward pressurization from the push part to the switch member.

It is preferred that a third open part for positioning the other side of the flexible printed circuit board outside the first housing is formed in the inside bottom surface.

It is preferred that at least one protrusion is formed in the inside bottom surface, and a hollow into which the protrusion is inserted is formed in the flexible printed circuit board assembly.

It is preferred that the first contact point includes one first negative terminal and a plurality of first positive terminals, and the second contact point includes a second negative terminal coupled to the first negative terminal and generally formed in any one of a top and bottom of the first barrier rib, and a plurality of second positive terminals coupled to the plurality of first positive terminals, respectively, and formed in any one of a top and bottom of the first barrier rib.

It is preferred that the connection line is formed to sequentially pass through the inside bottom surface, an inner circumferential surface of the first barrier rib, the top of the first barrier rib, and the outer circumferential surface of the first barrier rib, and couples the first contact point and the second contact point.

A mobile terminal according to an embodiment of the present inventive concept relates to a mobile terminal having a display on a front thereof. The mobile device includes a signal input device positioned at a back facing the front where the display is formed and controlling the mobile terminal by generating a direction signal and an execution signal in response to a user manipulation. The signal input device includes a first housing including a bottom surface and a first barrier rib upward formed from the bottom surface, wherein the bottom surface is divided into an inside bottom surface and outside bottom surface of the first barrier rib, a plurality of first contact points is formed on the inside bottom surface, and second contact points corresponding to the first contact points are formed on the outer circumferential surface of the first barrier rib; a flexible printed circuit board assembly seated on the inside bottom surface and formed to have a bottom surface on one side electrically coupled to the first contact points; a push button including a first upper part and a second barrier rib downward extended from the outer end of the first upper part, wherein a bottom of the second barrier rib is seated and positioned on the outside bottom surface in a way to horizontally move; and a conductive member positioned between an outer circumferential surface of the first barrier rib and an inner circumferential surface of the second barrier rib. A fine pattern for forming the first contact points, the second contact points, and connection lines between the first contact points and the second contact points is formed on the first housing by laser processing, and the fine pattern is filled with an electrical conductive material.

A signal input device according to an embodiment of the present inventive concept includes a third housing including a bottom surface and a fourth barrier rib upward formed from the outer end of the bottom surface, wherein a plurality of fourth contact points is formed on the bottom surface, and fifth contact points corresponding to the fourth contact points are formed on an inner circumferential surface of the fourth barrier rib; a flexible printed circuit board assembly seated on the bottom surface and formed to have a bottom surface on one side thereof electrically coupled to the fourth contact points; a push button positioned over the flexible printed circuit board assembly and formed to have an outer circumferential surface positioned to be isolated from the inner circumferential surface of the fourth barrier rib in a way to horizontally move; and a conductive member positioned between the inner circumferential surface of the fourth barrier rib and the outer circumferential surface of the push button, wherein a fine pattern for forming the fourth contact points, the fifth contact points, and connection lines between and the fourth contact points and the fifth contact points is formed on the third housing by laser processing, and the fine pattern is filled with an electrical conductive material.

The signal input device further includes a fourth housing including a third upper part and a fifth barrier rib downward extended from the outer end of the third upper part. It is preferred that a fourth open part opened so that the top of the push button is exposed is formed in the third upper part, and a bottom of the fifth barrier rib is coupled to the fourth barrier rib.

The signal input device further includes an elastic member positioned between the inner circumferential surface of the fourth barrier rib and the outer circumferential surface of the push button. It is preferred that the elastic member is positioned in an area where the conductive member is not positioned.

It is preferred that the fourth barrier rib of the third housing is formed to have a height corresponding to a lower area of the outer circumferential surface of the push button, wherein the conductive member is positioned to surround the lower area of the outer circumferential surface of the push button, and the signal input device further includes an elastic member positioned to surround an upper area of the outer circumferential surface of the push button.

It is preferred that the flexible printed circuit board assembly includes a flexible printed circuit board has sixth contact points, corresponding to the fourth contact points, formed at the bottom surface on the one side and has a connection part, coupled to an external device, formed on the other side thereof; and an ACF film attached to the bottom surface of the flexible printed circuit board on the one side and electrically coupling the fourth contact points and the sixth contact points by downward pressurization.

It is preferred that the flexible printed circuit board assembly further includes a switch member positioned at the top surface of the flexible printed circuit board on the one side thereof and generating an electrical signal by downward pressurization.

It is preferred that the signal input device further includes a push button externally exposed to allow a user to downward pressurize the switch member.

It is preferred that the push button includes a push part coupled to the top of the push button; and a column part positioned to penetrate a fifth open part formed in the push button, having one side coupled to the push part, and having the other side for delivering downward pressurization from the push part to the switch member.

It is preferred that a sixth open part for positioning the other side of the flexible printed circuit board outside the third housing is formed in the bottom surface.

It is preferred that at least one protrusion is formed in the bottom surface, and a hollow into which the protrusion is inserted is formed in the flexible printed circuit board assembly.

A mobile terminal according to an embodiment of the present inventive concept relates to a mobile terminal having a display on a front thereof. The mobile terminal includes a third housing including a bottom surface and a fourth barrier rib upward formed from the outer end of the bottom surface, wherein a plurality of fourth contact points is formed on the bottom surface, and fifth contact points corresponding to the fourth contact points are formed on an inner circumferential surface of the fourth barrier rib; a flexible printed circuit board assembly seated on the bottom surface and formed to have a bottom surface on one side thereof electrically coupled to the fourth contact points; a push button positioned over the flexible printed circuit board assembly and formed to have an outer circumferential surface positioned to be isolated from the inner circumferential surface of the fourth barrier rib in a way to horizontally move; and a conductive member positioned between the inner circumferential surface of the fourth barrier rib and the outer circumferential surface of the push button, wherein a fine pattern for forming the fourth contact points, the fifth contact points, and connection lines between and the fourth contact points and the fifth contact points is formed on the third housing by laser processing, and the fine pattern is filled with an electrical conductive material.

It is preferred that an accommodation groove for receiving the signal input device is formed at a back facing the front where the display is formed, the fourth barrier rib of the third housing is formed to have a height corresponding to a lower area of the outer circumferential surface of the push button, the conductive member is positioned to surround the lower area of the outer circumferential surface of the push button, and an elastic member is positioned between an upper area of the outer circumferential surface of the push button and an inner circumferential surface of the accommodation groove.

Advantageous Effects

The signal input device according to an embodiment of the present inventive concept may have effects in that the number of buttons included in the signal input device can be reduced because different types of input signals can be generated depending on a direction of a laterally pushed manipulation force, and a configuration can be simplified, a production cost can be significantly reduced and two or more input signals can be simultaneously generated because a laterally pushed manipulation force can be detected although a separate pressure sensor is not provided.

Effects of the present inventive concept are not limited to the aforementioned effects, and other effects not described above may be evidently understood by those skilled in the art from the following description.

DETAILED DESCRIPTION

Preferred embodiments according to the present inventive concept are described in detail with reference to the accompanying drawings. The same or similar element is assigned the same reference numeral regardless of its reference numeral, and a redundant description thereof is omitted.

Furthermore, in describing the present inventive concept, a detailed description of a related known technology will be omitted if it is determined to make the gist of the present inventive concept unnecessarily vague. Furthermore, it is to be noted that the accompanying drawings are merely intended to make easily understood the spirit of the present inventive concept and the spirit of the present inventive concept is not restricted by the accompanying drawings.

Hereinafter, a signal input device according to a first embodiment of the present inventive concept is described with reference to FIGS. 1 to 7.

The signal input device according to the first embodiment of the present inventive concept may be used as a single product, and is a device capable of controlling a corresponding mobile terminal by being attached to the back of the mobile terminal, such as a smart phone or a tablet PC. In particular, the signal input device is configured to selectively generate various types of input signals through one button.

As illustrated in FIGS. 1 to 4, the signal input device according to the first embodiment of the present inventive concept is configured to basically include a first housing 100, a flexible printed circuit board assembly 200, a push button 300, a conductive member 400, a second housing 500, an elastic member 600 and a push button 700.

The first housing 100 is an element including a bottom surface 110 and a first barrier rib 120 upward formed from the bottom surface 110. The bottom surface 110 may be partitioned into the inside bottom surface 111 and outside bottom surface 112 of the first barrier rib 120.

A plurality of first contact points 130 is formed on the inside bottom surface 111. Second contact points 140 corresponding to the first contact points 130 are formed on the outer circumferential surface of the first barrier rib 120. Moreover, connection lines 150 connecting the first contact points 130 and the second contact points are also formed on the outer circumferential surface of the first barrier rib 120.

In particular, when considering that the first housing 100 is not a conductor, it is preferred that the first contact points 130, the second contact points 140, and the connection lines 150 are formed using laser direct structuring (LDS). Specifically, fine patterns for forming the first contact points 130, the second contact points 140, and the connection lines 150 are formed on the first housing 100 made of a resin material using a laser, and a conductive material, such as copper/nickel plating, is plated on the fine patterns so that the first contact points 130 and the second contact points 140 are electrically coupled.

Moreover, it is preferred that the connection line 150 is formed to sequentially pass through the inside bottom surface 111, the inner circumferential surface of the first barrier rib 120, the top of the first barrier rib 120, and the outer circumferential surface of the first barrier rib 120 and to connect the first contact point 130 and the second contact point 140.

Furthermore, the first contact point 130 includes one first negative terminal and a plurality of first positive terminals. The second contact point 140 includes a second negative terminal coupled to the first negative terminal and a plurality of second positive terminals coupled to the first positive terminals.

In particular, the second negative terminal is formed to surround the outer circumferential surface of any one of the top and bottom of the first barrier rib 120. The plurality of second positive terminals is formed in the outer circumferential surface of the other of the top and bottom of the first barrier rib 120, but adjacent second positive terminals need to be isolated without coming into contact with each other.

The flexible printed circuit board assembly 200 is an element seated on the inside bottom surface 111 and configured to have one side on a bottom surface thereof electrically coupled to the first contact points 130. The flexible printed circuit board assembly 200 performs a function for delivering an electrical signal, generated by a manipulation of the push button 300 and the push button 700 to be described later, to another device coupled to the signal input device.

Figure 5:
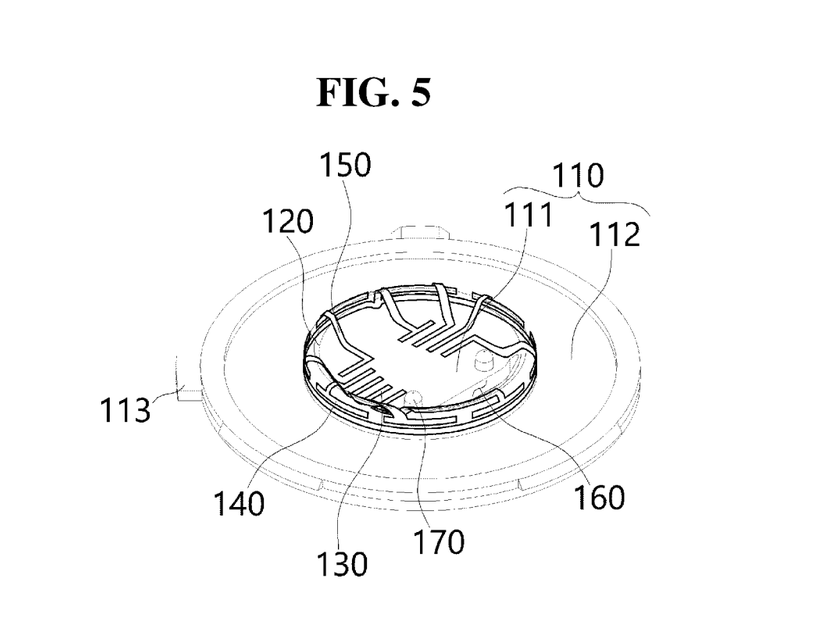
FIG. 5 is a diagram showing the configuration of a first housing in the signal input device according to the first embodiment of the present inventive concept.
Figure 6:
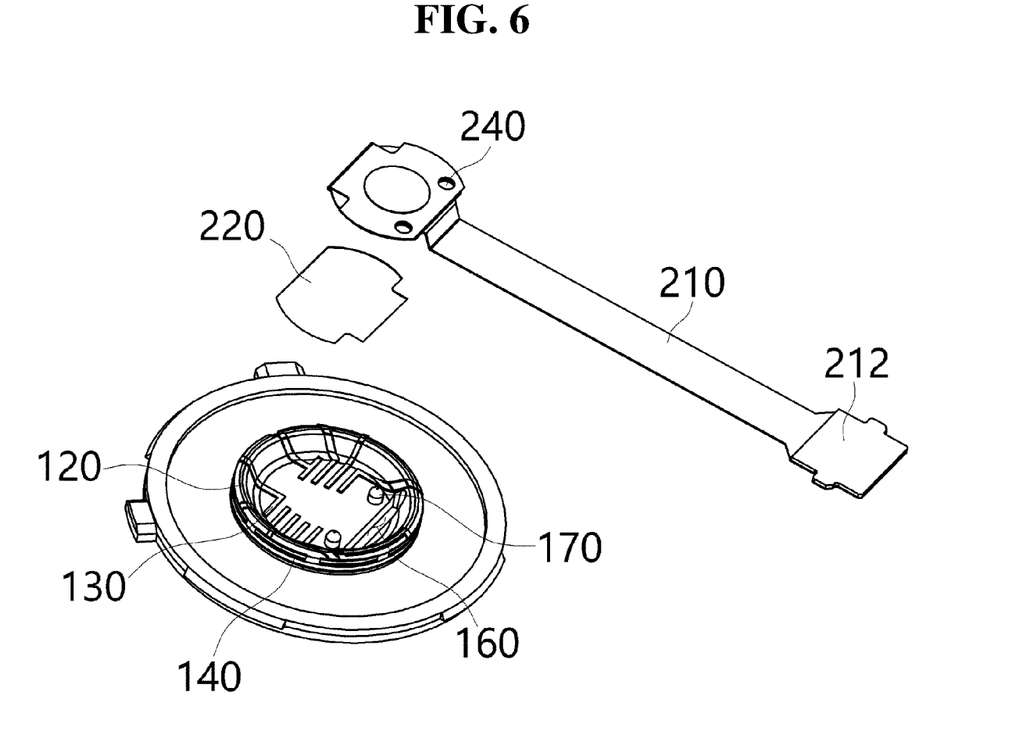
FIGS. 6 and 7 are diagrams for describing the coupling of the first housing and a flexible printed circuit board assembly 200 in the signal input device according to the first embodiment of the present inventive concept.
Figure 7:
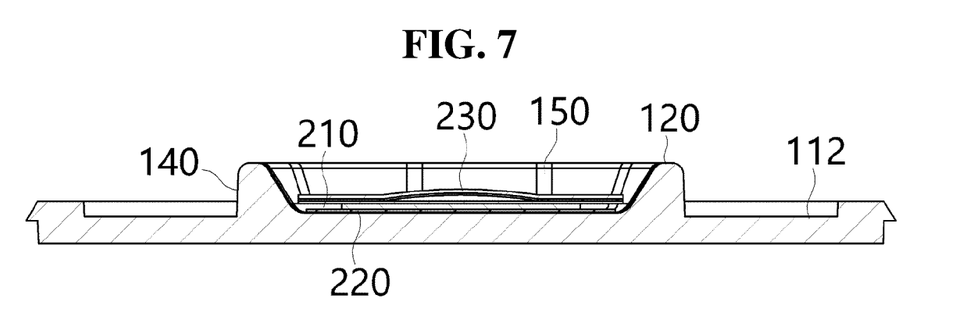

As illustrated in FIGS. 5 and 6, the flexible printed circuit board assembly 200 may be configured to include a flexible printed circuit board 210, an ACF film 220, and a switch member 230.

The flexible printed circuit board 210 is an element in which third contact points 211 corresponding to the first contact points 130 are formed on the bottom surface of the flexible printed circuit board on one side thereof and a connection part 212, that is, a connector coupled to an external device, is formed on the other side of the flexible printed circuit board.

In particular, the signal input device according to the first embodiment of the present inventive concept uses anisotropic conductive film (ACF) bonding for an electrical connection between the first contact points 130 of the first housing 100 and the third contact points 130 of the flexible printed circuit board 210. Such ACF Bonding is a bonding method of enabling electrical conduction up and down and providing insulation left and right using an anisotropic conductive film.

Specifically, after the ACF film 220 is disposed between the bottom surface of the flexible printed circuit board 210 on one side and the inside bottom surface 111 of the first housing 100, when heat, etc. is applied to the ACF film, the first contact points 130 and the third contact point 211 are electrically coupled by a conductive ball disposed within the ACF film 220.

Prior to the ACF bonding, the first contact points 130 and the third contact points 211 need to be precisely arranged. To this end, in the signal input device according to the first embodiment of the present inventive concept, the at least one protrusion 170 is formed on the inside bottom surface, and hollows 240 into which protrusions 170 may be inserted are formed in the flexible printed circuit board assembly 200. Accordingly, one side of the flexible printed circuit board assembly 200 can be accurately seated on the inside bottom surface 111 of the first housing 100.

The switch member 230 is an element positioned on the top surface of the flexible printed circuit board 210 one side thereof and generating an electrical signal by downward pressurization.

A dome key is preferably used as the switch member 230. Detailed contents of an operation of the switch member 230 are described later.

Furthermore, the flexible printed circuit board 210 can be coupled to another external device only when the other side of the flexible printed circuit board is positioned outside the first housing 100. To this end, a third open part 160 for pulling out the flexible printed circuit board 210 to the outside of the first housing 100 may be formed in the inside bottom surface 111 of the first housing 100.

As illustrated in FIGS. 1 to 4, the push button 300 is an element including a first upper part 310 and a second barrier rib 320 downward extended from the outer end of the first upper part 310, and is an element in which the bottom of the second barrier rib 320 is seated and positioned on the outside bottom surface 112 in a way to horizontally move. The conductive member 400 is an element positioned between the outer circumferential surface of the first barrier rib 120 and the inner circumferential surface of the second barrier rib 320.

The push button 300 does not move up and down, but is configured to be able to move a given distance laterally, such as front and back, and left and right. When a user laterally pushes the push button 300, the conductive member 400 comes into contact with one of the plurality of second contact points 140 disposed in the direction in which the push button 300 moves. An input signal corresponding to the touched second contact points is generated.

A push type signal input device in which an input signal is generated when a button is laterally pushed and pressurized as described above has already been proposed as various structures. A conventional push type signal input device has a disadvantage in that a production cost for the signal input device is very high because a pressure sensor for detecting lateral pressurization is essentially necessary.

In particular, if the signal input device is configured to generate different types of input signals depending on directions in which the button is pushed, the signal input device has a disadvantage in that the production cost problem is further increased because the pressure sensor must be mounted in each direction in which pressurization is applied.

The signal input device according to an embodiment of the present inventive concept has been proposed to solve the above disadvantage, and has the greatest characteristic in that the signal input device is configured to generate an input signal when pressurization is laterally applied even without a separate pressure sensor and to generate different types of input signals depending on directions in which pressurization is applied.

As described above, the second contact points 140 includes the second negative terminal and the second positive terminals. The second negative terminal is formed to surround the lower outer circumferential surface of the first barrier rib 120. The plurality of second positive terminals is formed on the upper outer circumferential surface of the first barrier rib 120, but adjacent second positive terminals may be isolated so that they do not come into contact with each other.

In this case, when a user laterally pushes and moves the push button 300, the conductive member 400 provided on the inner circumferential surface of the second barrier rib 320 of the push button comes into contact with the second contact point 140 formed on the outer circumferential surface of the first barrier rib 120 of the first housing 100. At this time, the conductive member 400 simultaneously comes into contact with the second negative terminal and the second positive terminal in a corresponding direction. Accordingly, an input signal in the corresponding direction is generated.

In particular, it is preferred that the second positive terminals are radially arranged around the vertical center axis of the inside space so that an input signal generated depending on a direction in which the push button 300 moves can be clearly classified.

In this case, if the signal input device according to an embodiment of the present inventive concept is configured to generate signals that move a mouse cursor or a screen, the signals basically need to be classified into diredtions, such as front, back, left and right. Accordingly, at least 4 second positive terminals need to be provided.

Furthermore, if a movement signal is to be additionally generated in a direction between the four directions, that is, a diagonal direction, 8 second positive terminals need to be provided. If two movement signals are to be generated in diagonal directions between the four directions, 12 second positive terminals need to be provided.

In other words, it is preferred that the number of positive terminals among the second contact points 140 formed on the outer circumferential surface of the first barrier rib 120 of the first housing 100 is basically 4 in the front, back, left and right directions, respectively, and is set as a structure in which positive terminals are added every four, that is, a multiple of 4.

As described above, the signal input device according to the first embodiment of the present inventive concept does not measure a lateral movement of the push button 200 using a separate sensor, but is configured to determine whether a second negative terminal and a second positive terminal among the second contact points 140 formed on the outer circumferential surface of the first barrier rib 120 of the first housing 100 is short-circuited. Accordingly, the signal input device according to the first embodiment of the present inventive concept has advantages in that a production cost can be reduced and a product can be reduced in weight because a manufacturing cost is very low and the signal input device is simple.

The second housing 500 is an element including a second upper part 510 and a third barrier rib 520 downward extended from the outer end of the second upper part 510, and is an element for preventing the push button 200 from being externally detached.

Furthermore, a first open part opened so that the first upper part 310 of the push button 300 is exposed is formed in the second upper part 510. The bottom of the third barrier rib 520 is configured to be coupled to the outer circumferential surface of the first housing 100.

In particular, in order to guarantee an accurate and easy coupling between the first housing 100 and the second housing 500, at least one first protruded part 113 is formed on the outer circumferential surface of the bottom surface 110 of the first housing 100, and at least one first groove part 521 corresponding to the first protruded part 113 is formed at the bottom of the third barrier rib 520 of the second housing 500. It is preferred that the first protruded part 113 is inserted into the first groove part 521 to couple the first housing 100 and the second housing 500.

On the contrary to this, at least one second groove part may be formed on the outer circumferential surface of the bottom surface 110 and at least one second protruded part may be formed at the bottom of the third barrier rib 520, so the second protruded part is inserted into the second groove part to couple the first housing 100 and the second housing 500. As the push button 300 is pushed and moved to any one side after the conductive member 400 enables any one second contact point 140, that is, any one second positive terminal, to come into contact with the second negative terminal, when pressurization applied to the push button 300 is released, if the state in which any one second positive terminal and the second negative terminal are electrically coupled continues to be maintained, an input signal may continue to be generated contrary to a user's intention.

In order to solve the aforementioned problem, the signal input device according to the first embodiment of the present inventive concept further includes the elastic member 600 for returning the location of the push button 300 so that the second contact points 140 and the conductive member 400 are isolated from each other when the push button 300 is laterally moved.

If the elastic member 600 is provided as described above, when a lateral and external force applied to the push button 300 is released, the push button 300 returns to its initial location by the elastic force of the elastic member 600. The signal input device has the state in which the second contact points 140 and the conductive member 400 have been separated from each other, that is, the state in which an input signal is not generated.

Figure 1:
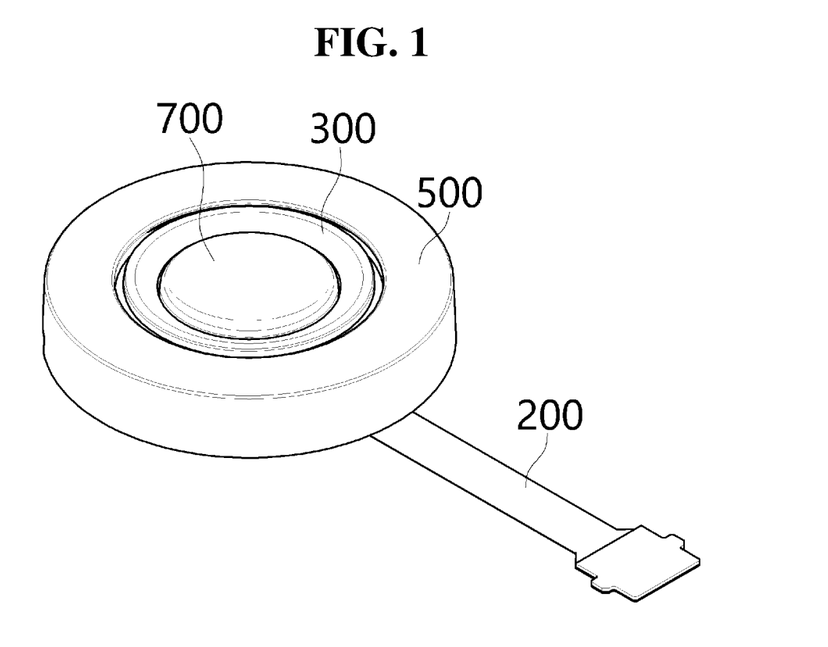
FIGS. 1 and 2 are perspective views of a signal input device according to a first embodiment of the present inventive concept.
Figure 2:
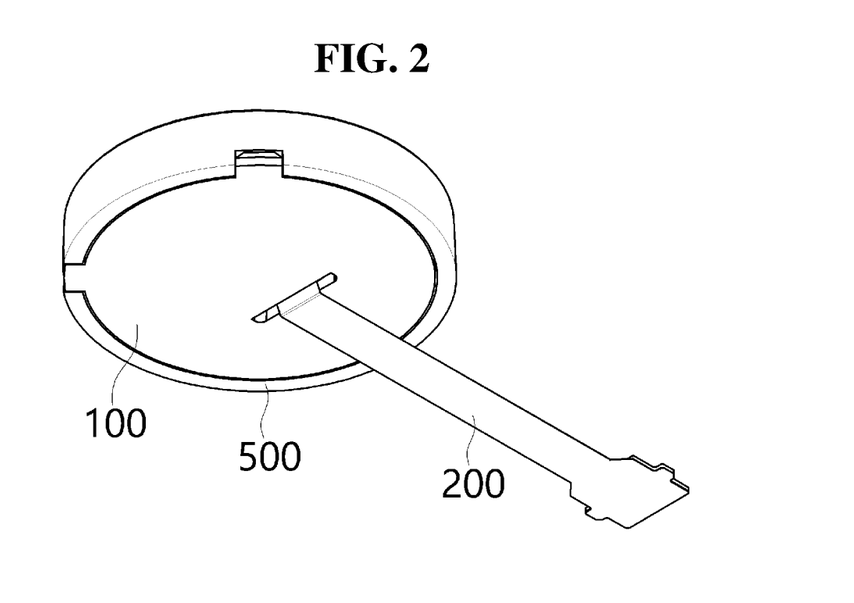
Figure 3:
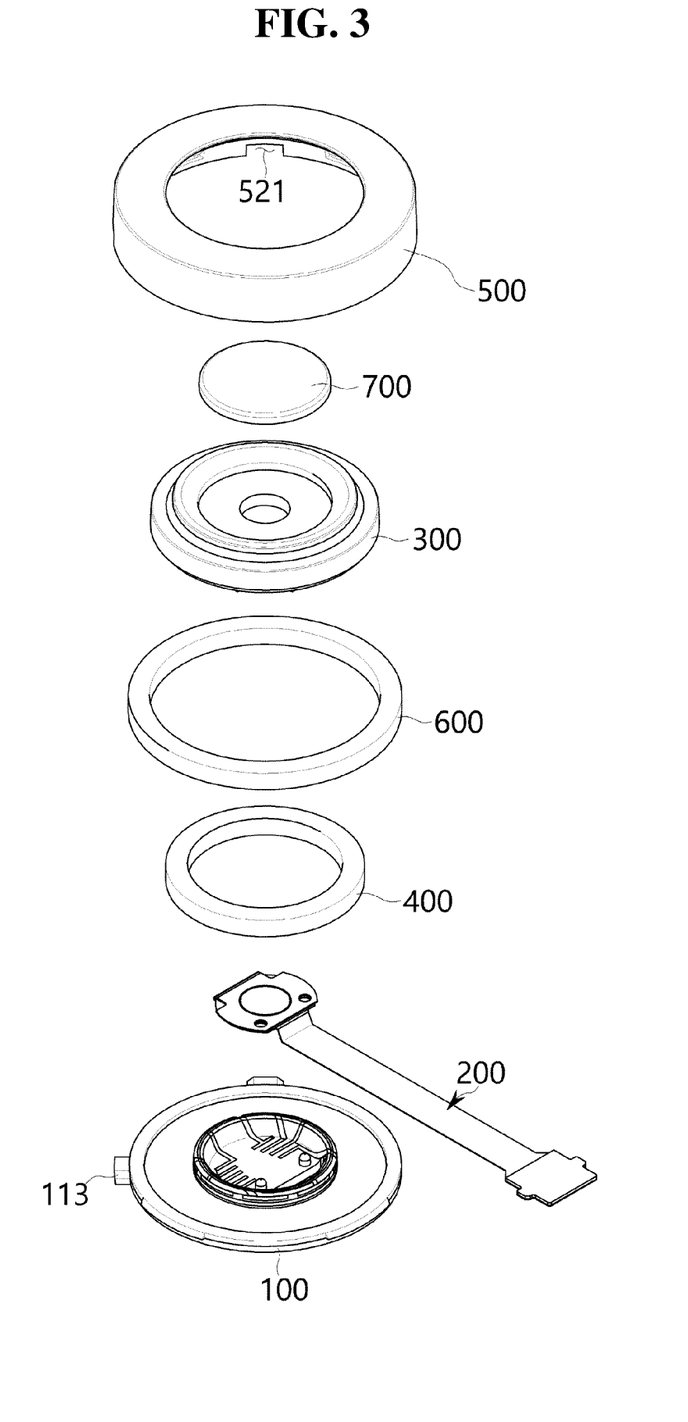
FIG. 3 is an exploded perspective view of the signal input device according to the first embodiment of the present inventive concept.
Figure 4:
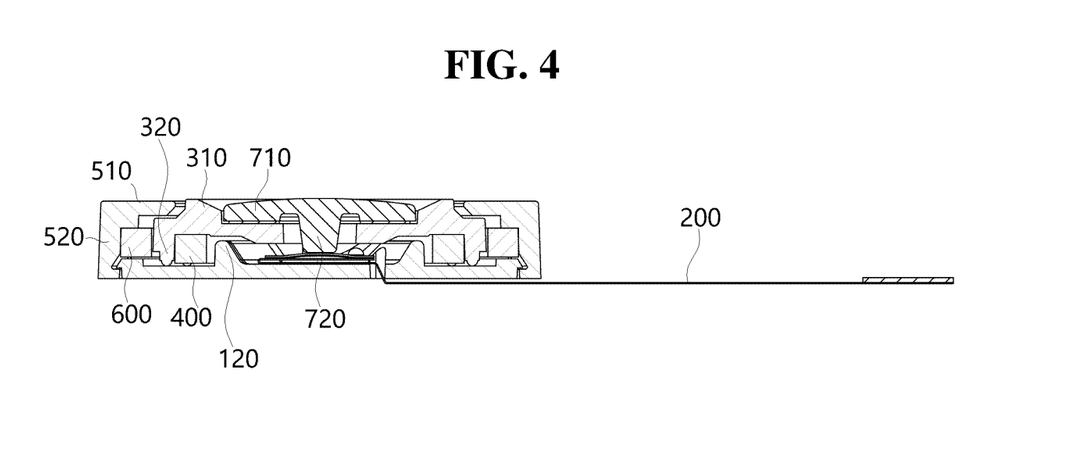
FIG. 4 is a cross-sectional view of the signal input device according to the first embodiment of the present inventive concept.

As illustrated in FIG. 3, in general, the elastic member 600 is positioned between the push button 300 and the second housing 500. Specifically, it is preferred that the elastic member 600 is positioned between the outer circumferential surface of the second barrier rib 320 of the push button 300 and the inner circumferential surface of the third barrier rib 520 of the second housing 500.

Furthermore, as described above, the elastic member 600 is inserted between the outer circumferential surface of the second barrier rib 320 and the inner circumferential surface of the third barrier rib 520. Accordingly, the elastic member 600 may be applied as an elastic material, such as carbon sponge or silicone that applies a restoring elasticity to the push button 300 as the elastic member is compressed when the push button 300 laterally moves, and may be applied as a spring that applies an elastic force in the direction in which the elastic member returns to its original state.

Furthermore, the signal input device according to the first embodiment of the present inventive concept may be configured to generate a different type of an input signal by a downward pressurization force, in addition to a manipulation that laterally pushes the push button 300.

That is, as described above, the flexible printed circuit board assembly 200 includes the switch member 230, such as a dome key positioned at the top of the flexible printed circuit board 210 one side thereof and generating an electrical signal by downward pressurization. The flexible printed circuit board assembly may further include the push button 700 externally exposed to allow a user to downward pressurize the switch member 230.

In this case, if the entire push button 700 is configured to fully penetrate the push button 300 upward, a loss of the push button 700 may be caused. Accordingly, the push button 700 is preferably configured to include a push part 710 seated in the first upper part of the push button 300 and a column part 720 positioned to penetrate a second open part 311 formed in the first upper part 310 and having one side coupled to the push part 710 and the other side for delivering downward pressure from the push part 710 to the switch member 230.

The signal input device according to the first embodiment of the present inventive concept, as described above, includes the push button 300 for generating a signal by a lateral movement and the push button 700 for generating a signal by downward pressurization, but may generate various signals by combinations of manipulations of the push button 300 and the push button 700.

Hereinafter, a signal input device according to a second embodiment of the present inventive concept is described with reference to FIG. 8, but a detailed description of contents redundant with the first embodiment of the present inventive concept is omitted.

The signal input device according to the second embodiment of the present inventive concept may be used as a single product, and is a device capable of controlling a corresponding mobile terminal by being attached to the back of the mobile terminal, such as a smart phone or a tablet PC. In particular, the signal input device is configured to selectively generate various types of input signals through one button.

Figure 8:
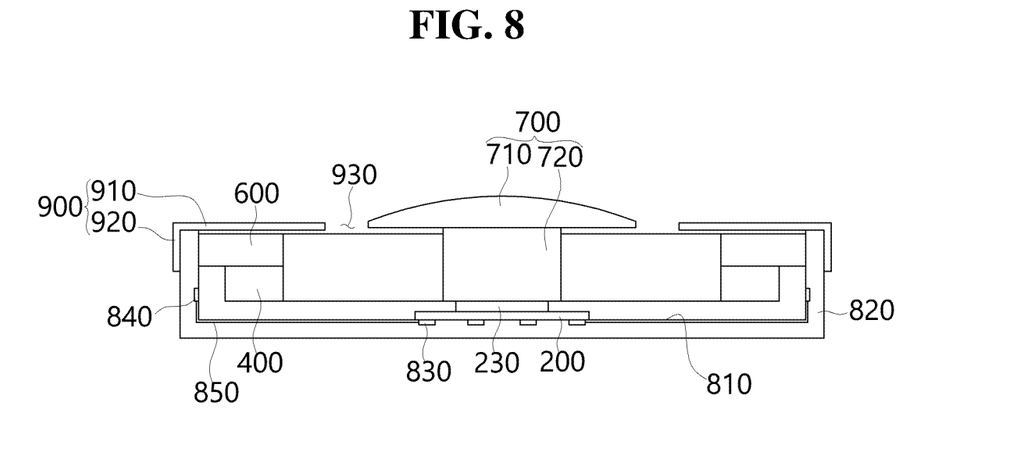
FIG. 8 is a cross-sectional view of a signal input device according to a second embodiment of the present inventive concept.

As illustrated in FIG. 8, the signal input device according to the second embodiment of the present inventive concept is configured to basically include a third housing 800, a flexible printed circuit board assembly 200, a push button 300, a conductive member 400, a fourth housing 900, an elastic member 600 and a push button 700.

The third housing 800 includes a bottom surface 810 and a fourth barrier rib 820 upward formed from the outer end of the bottom surface 810.

In particular, a plurality of fourth contact points 830 is formed on the bottom surface 810 of the third housing 800. Fifth contact points 840 corresponding to the fourth contact points 830 are formed on the inner circumferential surface of the fourth barrier rib 820. The fourth contact points 830, the fifth contact points 840, and connection lines 850 between the fourth contact points 830 and the fifth contact points 840 are formed by forming a fine pattern and then plating/filling an electrical conductive material on/into the fine pattern by laser processing, as in the signal input device according to the first embodiment of the present inventive concept.

In particular, each of the fourth contact points 830 and the fifth contact points 840 is configured with one negative terminal and a plurality of positive terminals, like each of the first contact points 130 and second contact points 140 of the signal input device according to the first embodiment of the present inventive concept.

The flexible printed circuit board assembly 200 is an element seated on the bottom surface 810 of the third housing 800 and having a bottom surface on one side thereof electrically coupled to the fourth contact points 830.

Specifically, the flexible printed circuit board assembly 200 may include a flexible printed circuit board 210 having sixth contact points, corresponding to the fourth contact points 830, formed on a bottom surface on one side thereof and having a connection part, coupled to an external device, formed on the other side thereof, an ACF film 220 attached to the bottom surface of the flexible printed circuit board 210 on one side thereof and electrically connecting the fourth contact points 830 and the sixth contact points by downward pressurization, and a switch member 230 positioned on the top surface of the flexible printed circuit board 210 on one side thereof to generate an electrical signal by downward pressurization.

Before the fourth contact points 830 and the sixth contact points electrically coupled using the ACF film 220, the fourth contact points 830 and the sixth contact points need to be accurately aligned. To this end, in the signal input device according to the second embodiment of the present inventive concept, at least one protrusion is formed on the bottom surface 810 of the third housing 800, and a hollow into which the protrusion may be inserted is formed in the flexible printed circuit board assembly 200. Accordingly, one side of the flexible printed circuit board assembly 200 can be accurately seated on the bottom surface 810 of the third housing 800.

The signal input device can be coupled to another external device only when the other side of the flexible printed circuit board 210 is positioned outside the first housing 100. To this end, a fourth open part for pulling out the flexible printed circuit board 210 to the outside of the third housing 800 may be formed in the bottom surface 810 of the third housing 800.

The push button 300 is an element positioned over the flexible printed circuit board assembly 200 and configured to have an outer circumferential surface thereof isolated from the inner circumferential surface of the fourth barrier rib 820 so that the push button is horizontally moved.

The conductive member 400 is an element positioned between the inner circumferential surface of the fourth barrier rib 820 and the outer circumferential surface of the push button 300. An electrical connection is formed between the positive terminal and the negative terminal among the fifth contact points 840 by the conductive member 400, as in the signal input device according to the first embodiment of the present inventive concept. Accordingly, an input signal in a corresponding direction is generated.

The fourth housing 900 is an element for preventing the push button 300 from being externally detached, and includes a third upper part 910 and a fifth barrier rib 920 downward extended from the outer end of the third upper part 910.

In this case, a fourth open part 930 opened so that the top of the push button 300 is exposed is formed in the third upper part 910. The bottom of the fifth barrier rib 920 is coupled to the fourth barrier rib 820.

Furthermore, the elastic member 600 is positioned between the inner circumferential surface of the fourth barrier rib 820 and the outer circumferential surface of the push button 300. As illustrated in FIG. 8, the elastic member 600 needs to be positioned in an area where the conductive member 400 is not positioned.

Furthermore, the push button 700 is an element exposed to the outside so that the push button downward pressurizes the switch member 230. The push button 700 includes a push part 710 seated on the push button 300 and a column part 720 positioned to penetrate a fifth open part formed in the and the push button 300, having one side coupled to the push part 710 and the other side for delivering downward pressure from the push part to the switch member.

Figure 9:
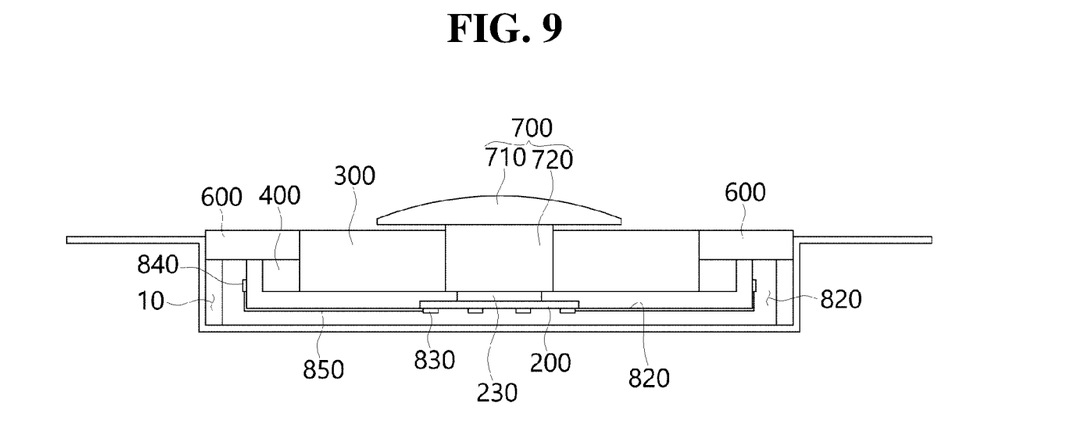
FIG. 9 is a cross-sectional view of a signal input device according to a third embodiment of the present inventive concept.

Hereinafter, a signal input device according to a third embodiment of the present inventive concept is described below with reference to FIG. 9, but a detailed description of contents redundant with the first and second embodiments of the present inventive concept is omitted.

The signal input device according to the third embodiment of the present inventive concept is a device capable of controlling a corresponding mobile terminal by being attached to the back of the mobile terminal, such as a smart phone or a tablet PC. In particular, the signal input device is configured to selectively generate various types of input signals through one button.

The signal input device according to the third embodiment of the present inventive concept includes all of the aforementioned elements of the signal input device according to the second embodiment of the present inventive concept except the fourth housing 900.

The signal input device according to the third embodiment of the present inventive concept is directly inserted into an accommodation groove 10 formed in the back of the mobile terminal. Accordingly, the accommodation groove 10 formed in the back of the mobile terminal plays a role as the fourth housing 900 of the signal input device according to the second embodiment of the present inventive concept.

In particular, it is preferred that the signal input device according to the third embodiment of the present inventive concept has dustproof and waterproof functions when considering that the signal input device is directly mounted on the accommodation groove 10 at the back of a mobile terminal.

To this end, in the signal input device according to the third embodiment of the present inventive concept, the fourth barrier rib 820 of the third housing 800 is formed to have a height corresponding to an area under the outer circumferential surface of the push button 300. In this case, the conductive member 400 is positioned to surround an area under the outer circumferential surface of the push button

300. The elastic member 600 is positioned to surround an area under the outer circumferential surface of the push button 300.

Preferably, when the elastic member 600 is positioned between the outer circumferential surface of the push button 300 and the inner circumferential surface of the accommodation groove 10, the elastic member 600 can apply a restoring force to the push button 800 and also block an alien substance from entering the accommodation groove 10.

Moreover, the elastic member 600 may have a waterproof effect by selecting a waterproof property in addition to an elastic force.

The embodiments described in this specification and the accompanying drawings merely illustrate some of the technical spirit included in the present inventive concept. Accordingly, the embodiments disclosed in this specification are not intended to limit the technical spirit of the present inventive concept, but illustrate the technical spirit of the present inventive concept. Accordingly, it is evident that the scope of the technical spirit of the present inventive concept is not restricted by the embodiments. All of modified examples and detailed embodiments which may be easily inferred by those skilled in the art without departing from the scope of the technical spirit included in the specification and drawings of the present inventive concept should be construed as being included in the scope of rights of the present inventive concept.

The invention claimed is:

1. A signal input device comprising: a first housing comprising a bottom surface and a first barrier rib upward formed from the bottom surface, wherein the bottom surface is divided into an inside bottom surface and outside bottom surface of the first barrier rib, a plurality of first contact points is formed on the inside bottom surface, and second contact points corresponding to the first contact points are formed on the outer circumferential surface of the first barrier rib; a flexible printed circuit board assembly seated on the inside bottom surface and formed to have a bottom surface on one side electrically coupled to the first contact points; a push button comprising a first upper part and a second barrier rib downward extended from an outer end of the first upper part, wherein a bottom of the second barrier rib is seated and positioned on the outside bottom surface in a way to horizontally move; a conductive member positioned between an outer circumferential surface of the first barrier rib and an inner circumferential surface of the second barrier rib, wherein a fine pattern for forming the first contact points, the second contact points, and connection lines between the first contact points and the second contact points is formed on the first housing by laser processing, and the fine pattern is filled with an electrical conductive material; and a second housing comprising a second upper part and a third barrier rib downward extended from an outer end of the second upper part, wherein a first open part opened so that the first upper part is exposed is formed in the second upper part, and a bottom of the third barrier rib is coupled to the outer circumferential surface of the bottom surface of the first housing.

2. The signal input device of claim 1, further comprising an elastic member positioned between an outer circumferential surface of the second barrier rib and an inner circumferential surface of the third barrier rib.

3. The signal input device of claim 1, wherein: at least one first protruded part is formed in the outer circumferential surface of the bottom surface, at least one first groove part is formed at a bottom of the third barrier rib, and the first protruded part is inserted into the first groove part to couple the first housing and the second housing.

4. The signal input device of claim 1, wherein: at least one second groove part is formed from the outer circumferential surface of the bottom surface, at least one second protruded part is formed at the bottom of the third barrier rib, and the second protruded part is inserted into the second groove part to couple the first housing and the second housing.

5. The signal input device of claim 1, wherein the flexible printed circuit board assembly comprises:
a flexible printed circuit board has third contact points, corresponding to the first contact points, formed at the bottom surface on the one side and has a connection part, coupled to an external device, formed on the other side thereof; and
an ACF film attached to the bottom surface of the flexible printed circuit board on the one side and electrically coupling the first contact points and the third contact points by downward pressurization.

6. The signal input device of claim 5, wherein the flexible printed circuit board assembly further comprises a switch member positioned at the top surface of the flexible printed circuit board on the one side thereof and generating an electrical signal by downward pressurization.

7. The signal input device of claim 6, further comprising a push button externally exposed to allow a user to downward pressurize the switch member.

8. The signal input device of claim 7, wherein the push button comprises:
a push part coupled to a first upper part of the push button; and
a column part positioned to penetrate a second open part formed in the first upper part, having one side coupled to the push part, and having the other side for delivering downward pressurization from the push part to the switch member.

9. The signal input device of claim 5, wherein a third open part for positioning the other side of the flexible printed circuit board outside the first housing is formed in the inside bottom surface.

10. The signal input device of claim 5, wherein:
at least one protrusion is formed in the inside bottom surface, and
a hollow into which the protrusion is inserted is formed in the flexible printed circuit board assembly.

11. The signal input device of claim 1, wherein:
the first contact point comprises one first negative terminal and a plurality of first positive terminals, and
the second contact point comprises a second negative terminal coupled to the first negative terminal and generally formed in any one of a top and bottom of the first barrier rib, and a plurality of second positive terminals coupled to the plurality of first positive terminals, respectively, and formed in any one of a top and bottom of the first barrier rib.

12. The signal input device of claim 1, wherein the connection line is formed to sequentially pass through the inside bottom surface, an inner circumferential surface of the first barrier rib, a top of the first barrier rib, and the outer circumferential surface of the first barrier rib, and couples the first contact point and the second contact point.

13. A mobile terminal having a display on a front thereof, comprising: a signal input device positioned at a back facing the front where the display is formed and controlling the mobile terminal by generating a direction signal and an execution signal in response to a user manipulation, wherein the signal input device comprises: a first housing comprising a bottom surface and a first barrier rib upward formed from the bottom surface, wherein the bottom surface is divided into an inside bottom surface and outside bottom surface of the first barrier rib, a plurality of first contact points is formed on the inside bottom surface, and second contact points corresponding to the first contact points are formed on the outer circumferential surface of the first barrier rib; a flexible printed circuit board assembly seated on the inside bottom surface and formed to have a bottom surface on one side electrically coupled to the first contact points; a push button comprising a first upper part and a second barrier rib downward extended from an outer end of the first upper part, wherein a bottom of the second barrier rib is seated and positioned on the outside bottom surface in a way to horizontally move; a conductive member positioned between an outer circumferential surface of the first barrier rib and an inner circumferential surface of the second barrier rib, wherein a fine pattern for forming the first contact points, the second contact points, and connection lines between the first contact points and the second contact points is formed on the first housing by laser processing, and the fine pattern is filled with an electrical conductive material; and a second housing comprising a second upper part and a third barrier rib downward extended from an outer end of the second upper part, wherein a first open part opened so that the first upper part is exposed is formed in the second upper part, and a bottom of the third barrier rib is coupled to the outer circumferential surface of the bottom surface of the first housing.

14. A signal input device comprising: a third housing comprising a bottom surface and a fourth barrier rib upward formed from an outer end of the bottom surface, wherein a plurality of fourth contact points is formed on the bottom surface, and fifth contact points corresponding to the fourth contact points are formed on an inner circumferential surface of the fourth barrier rib; a flexible printed circuit board assembly seated on the bottom surface and formed to have a bottom surface on one side thereof electrically coupled to the fourth contact points; a push button positioned over the flexible printed circuit board assembly and formed to have an outer circumferential surface positioned to be separated from the inner circumferential surface of the fourth barrier rib in a way to horizontally move; a conductive member positioned between the inner circumferential surface of the fourth barrier rib and the outer circumferential surface of the push button, wherein a fine pattern for forming the fourth contact points, the fifth contact points, and connection lines between and the fourth contact points and the fifth contact points is formed on the third housing by laser processing, and the fine pattern is filled with an electrical conductive material; and a second housing comprising a second upper part and a third barrier rib downward extended from an outer end of the second upper part, wherein a first open part opened so that the first upper part is exposed is formed in the second upper part, and a bottom of the third barrier rib is coupled to the outer circumferential surface of the bottom surface of the third housing.

\* \* \* \* \*